United States Patent [19]

Tanaka et al.

[11] Patent Number: 5,258,649
[45] Date of Patent: Nov. 2, 1993

[54] SEMICONDUCTOR DEVICE AND ELECTRONIC APPARATUS USING SEMICONDUCTOR DEVICE

[75] Inventors: Akira Tanaka; Kazuji Yamada; Tadahiko Miyoshi, all of Hitachi; Kanji Otsuka, Higashiyamato, all of Japan

[73] Assignee: Hitachi, Ltd., Tokyo, Japan

[21] Appl. No.: 918,137

[22] Filed: Jul. 23, 1992

Related U.S. Application Data

[63] Continuation of Ser. No. 519,846, May 7, 1990, abandoned.

[30] Foreign Application Priority Data

May 20, 1989 [JP] Japan .................. 1-127556

[51] Int. Cl.⁵ .................. H01L 23/02; H01L 23/48
[52] U.S. Cl. .................. 257/787; 257/796; 257/780; 257/783; 257/734; 257/707; 257/722
[58] Field of Search .................. 357/80, 81, 74, 79, 357/72; 257/787, 796, 780, 783, 734, 707, 722

[56] References Cited

U.S. PATENT DOCUMENTS

| | | | |
|---|---|---|---|
| 3,911,327 | 10/1975 | Murari et al. | 357/79 |
| 4,069,497 | 1/1978 | Steidlitz | 357/79 |
| 4,385,310 | 5/1983 | Houston | 357/65 |
| 4,617,585 | 10/1986 | Yasui | 357/72 |
| 4,620,215 | 10/1986 | Lee | 357/81 |
| 4,647,959 | 3/1987 | Smith | 357/81 |
| 4,812,949 | 3/1989 | Fontan et al. | 357/80 |
| 4,878,108 | 10/1989 | Phelps, Jr. et al. | 357/81 |
| 4,939,570 | 7/1990 | Bickford et al. | 357/81 |
| 4,953,173 | 8/1990 | Fujitsu | 357/81 |
| 4,965,660 | 10/1990 | Ogihara et al. | 357/81 |

FOREIGN PATENT DOCUMENTS 61-168248  7/1986  Japan .................. 357/72

OTHER PUBLICATIONS

"Flat Package using Three-Layer Film", IBM TDB, vol. 31, No. 8, Jan. 1989, p. 119.

Primary Examiner—Eugene R. LaRoche
Assistant Examiner—Viet Q. Nguyen
Attorney, Agent, or Firm—Antonelli, Terry, Stout & Kraus

[57] ABSTRACT

A silicon chip is mounted on a portion a heat dissipation body, and a carrier film is inserted into a resin composition material. Each of input/output electrode portions of the silicon chip is connected electrically to each of lead wires of the carrier film. The electrical connection between the silicon chip and a circuit substrate is carried out by the carrier film. Another portion of the heat dissipation body is exposed on a surface of the resin composition material. A fixing means for fixing the resin composition material is formed integrally to the resin composition material or to the heat dissipation body. The resin composition material is fixed to a circuit substrate through the fixing means. The mechanical fixing between the resin composition material and the circuit substrate is carried out by the fixing means, which is separate from the carrier film. A heat dissipation fin may be provided on the heat dissipation body.

48 Claims, 8 Drawing Sheets

SEMICONDUCTOR DEVICE AND ELECTRONIC APPARATUS USING SEMICONDUCTOR DEVICE

This application is a continuation of application Ser. No. 519,846, filed on May 7, 1990 abandoned.

BACKGROUND OF THE INVENTION

The present invention relates to a semiconductor device and an electronic apparatus using a semiconductor device, and more particularly to a package structure type semiconductor device and an electronic apparatus, such as an electronic computer using a package structure type semiconductor device.

In particular, the present invention is applied suitably to the package structure type semiconductor device having a large number of input/output electrode portions of above 400 and a heat generation amount of above 5 W.

Recently, in response to a demand for a high speeding-up of the execution time and a small scaling-up in the electronic computer, there has been progress in obtaining a high integration and a large scaling-up for the semiconductor element which is provided in the electronic computer. In company with this, there has a tendency to increase the number of input/output electrode portions per one unit of the semiconductor element and also to increase the heat generation amount in the semiconductor element.

As a structure for mounting a large number of the input/output electrode portions of the semiconductor element, there is known an QFP (Quad Flat Package) system in which the lead wires for the input/output electrode portions are provided through four direction sides of the semiconductor element.

In the above stated QFP system, until now a lead frame being formed by punching a metallic plate has been used as an input/output terminal or a lead wire. However, it is difficult to make a lead space small in the above stated lead frame structure because of the mechanical punching manufacturing method.

Therefore, recently TAB (Tape Automated Bonding) system has been developed, in which a portion between the input/output electrode portion of the semiconductor element provided on the package member and an outside input/output terminal (a lead wire) portion is connected by a carrier film in which the lead wires are formed on a flexible substance film member of the carrier film.

Since the carrier film can be shorten considerably in term of lead space (a space between adjacent two lead wires) in comparison with that of the above stated metallic plate lead frame, it is useful for the small scaling-up for the semiconductor element.

Besides, in the package member of the semiconductor element, the package member using the resin composition material is increasing from the aspect of mass-production. The package member using the resin composition material has a small dielectric constant and also gives a little effect in the propagation for the electrical signal (a propagation delay).

However, in general the resin composition material has a small thermal conductivity, since the thermal resistance in the package member is made large, and it has a problem about the encapsulating for the semiconductor element having the large heat generation amount.

Then, as a method for encapsulating the semiconductor element having the large heat generation amount using the resin composition material, a package structure type semiconductor device, in which an insulated base body for mounting the semiconductor element serves as a heat dissipation plate, has been developed.

According to employment of this structure, even in the semiconductor element having a comparative large heat generation amount of about 3 W (an upper limit), it is possible to obtain the package member using the resin composition material.

For the small scaling-up of the semiconductor element having the large input/output electrode portion number, it is necessary to shorten the lead space.

In the conventional method using the metallic plate lead frame, it has a limit in the lead space, also it is necessary to take a large area for the wiring enlargement portion, therefore it is impossible to make small the package structure size of the semiconductor device.

There has been proposed a package structure semiconductor device. The package structure of this semiconductor device comprises a first outside terminal for electrically connecting an electronic component in which a chip is packaged and a wiring substrate, and a second outside terminal for supporting and fixing the electronic component. The first outside terminal and the second outside terminal are provided separately and distinctly. By this separated provision structure in the package structure type semiconductor device comprising the outside terminal for electrically connecting the electronic component and the support portion for supporting and fixing the electronic component, the number of the lead wires are increased through slenderizing the dimension of the lead wire for the electrical connection. (Japanese Patent Laid-Open Sho No. 216256/1987).

However, in the package structure type semiconductor device which requires many input/output electrode portions through a higher integration, it is insufficient still even with the above stated structure. Further, it is necessary to escape positively the heat generation, which increases in company with the higher integration and the larger scaling-up in the semiconductor element, toward the package member outside.

SUMMARY OF THE INVENTION

An object of the present invention is to provide a semiconductor device and an electronic apparatus using a semiconductor device wherein an electrical connection for a semiconductor element having a large heat generation amount and having a large number of input/output electrode portions can be obtained fully.

Another object of the present invention is to provide a semiconductor device and an electronic apparatus using a semiconductor device wherein a support force for supporting a package member, which packages a semiconductor element, to a wiring substrate can be obtained fully.

A further object of the present invention is to provide a semiconductor device and an electronic apparatus using a semiconductor device wherein a high reliability of an electrical connection and a mechanical connection for a semiconductor element can be attained.

A further object of the present invention is to provide a semiconductor device and an electronic apparatus using a semiconductor device wherein a high density and a high integration for a semiconductor element having a heat generation amount of above 5 W and having a number of input/output electrode portions of above 400 can be obtained.

A further object of the present invention is to provide a semiconductor device and an electronic apparatus using a semiconductor device wherein an improved propagation delay in an electric signal can be obtained.

In accordance with the present invention, a semiconductor device having a package structure comprises a heat dissipation body, a semiconductor element being mounted on the heat dissipation body, the semiconductor element having input/output electrode portions, a package member for packaging the semiconductor element, a flexible insulated substance member being inserted between the package member, and the flexible insulated substance member having lead wires, each of the input/output electrode portions of the semiconductor element being connected electrically to each of the lead wires of the flexible insulated substance member.

The heat dissipation body is exposed on a surface of the package member, and the package member has a fixing means for fixing the package, member to a wiring substrate, the wiring substrate being connected electrically to the lead wires of said flexible insulated substance member.

The heat dissipation body is exposed on a surface of the package member, the heat dissipation body has a dissipation fin member, and the package member has a fixing means for fixing the package member to a wiring substrate, the fixing means is formed integrally with the package member, the wiring substrate is connected electrically to the lead wires of the flexible insulated substance member.

The heat dissipation body is exposed on a surface of the package member, and the heat dissipation body has a fixing means for fixing the package member to a wiring substrate, the wiring substrate is connected electrically to the lead wires of said flexible insulated substance member.

In accordance with the present invention, a semiconductor device having a package structure comprises an electrically insulated base body, a semiconductor element being mounted on the electrically insulated base body, the semiconductor element having input/output electrode portions, a package member for packaging the semiconductor element, a flexible insulated substance member being inserted between the package member, and the flexible insulated substance member having lead wires, each of the input/output electrode portions of the semiconductor element being connected electrically to each of the lead wires of the flexible insulated substance member.

The electrically insulated base body is exposed on a surface of the package member, and the package member has a fixing means for fixing the package member to a wiring substrate, the fixing means is formed on the package member, the wiring substrate is connected electrically to the lead wires of the flexible insulated substance member.

The electrically insulated base body is exposed on a surface of the package member, and the electrically insulated base body has a fixing means for fixing the package member to a wiring substrate, the fixing means is formed on the electrically insulated base body, the wiring substrate is connected electrically to the lead wires of the flexible insulated substance member.

According to the present invention, since the electrical connection between the semiconductor device and another circuit substrate is carried out by the carrier film, and further the mechanical fixing is carried out by the provision of the fixing means, respectively, the reliabilities on the electrical connection and the mechanical connection in the semiconductor device can be heighten, therefore the high density and the high integration in the semiconductor device can be attained.

In particular, the semiconductor device having the high density and the high integration and having further the heat generation amount of more than 5 W can be provided.

Further, in the present invention, by using the carrier film wiring, the electronic apparatus having the small propagation delay in the signal can be provided.

DESCRIPTION OF THE INVENTION

Figure 1A:
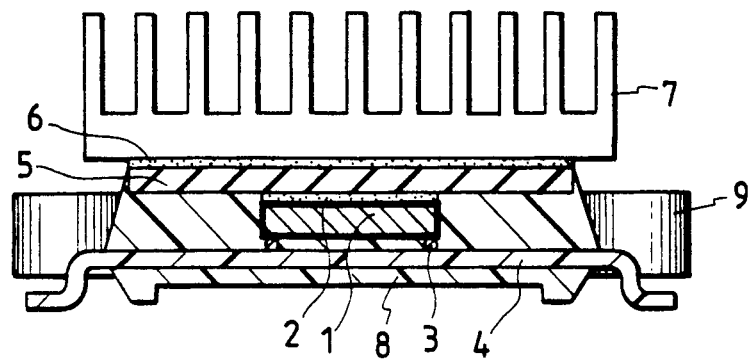
FIG. 1A is a cross-sectionally schematic view showing one embodiment of a semiconductor device according to the present invention.
Figure 1B:
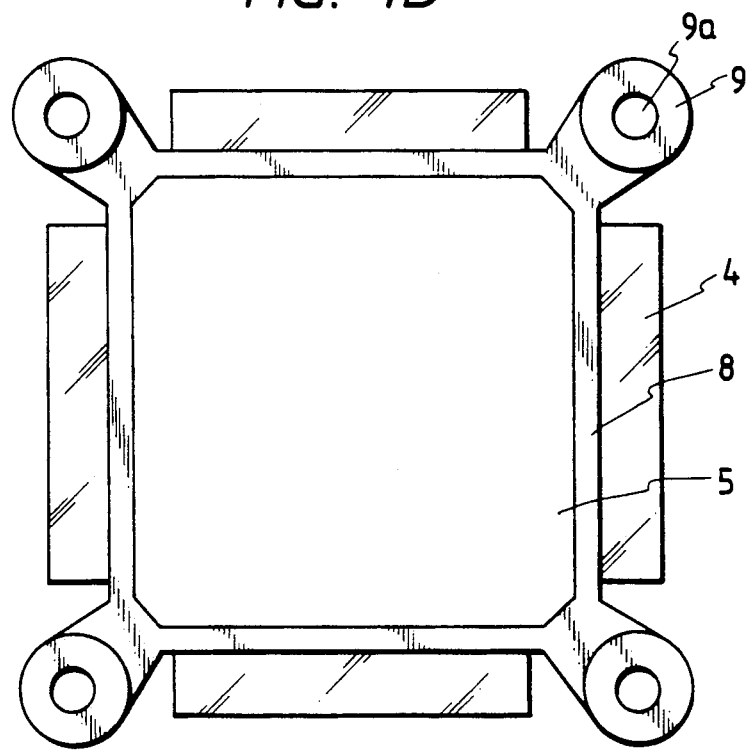
FIG. 1B is a top view showing one embodiment of the semiconductor device shown in FIG. 1A.

In the semiconductor device according to the present invention, as shown in FIGS. 1A and 1B, a semiconductor element 1 having a package structure is mounted on a heat dissipation body which comprises an electrically insulated base body 5, and a rear surface of the heat dissipation body is disposed on a surface of a package member, which is formed by an encapsulating resin composition material 8, so as to dissipate the heat.

Input/output electrode portions of the semiconductor element 1 are connected electrically to a carrier film 4 by solder bumps 3 and the carrier film 4 is drawn toward the package structure outside. On the carrier film 4, wiring patterns or lead wires are formed with corresponding numbers to the number of the input/output electrode portions of the semiconductor element 1.

Further, on the package member, besides the wiring patterns on the carrier film 4, a fixing means 9 is provided as a means for fixing the package member during the mounting of the package member on a wiring substrate such as a circuit substrate.

By this fixing means 9, since it imposes no burden for supporting the package member on the carrier film 4, the carrier film 4 can form with an optional shape, and it can heighten the reliability on the electrical connection for the wiring substrate, accordingly it is possible to increase the number of the input/output electrode portions of the semiconductor element 1 in comparison with the conventional semiconductor device.

Further, the heat dissipation body comprising the electrically insulated base body 5 may provide a heat dissipation fin 7 as shown in drawing. Since this dissipation fin 7, can significantly improve the heat dissipation characteristic, it is possible to mount a semiconductor element 1 having a large heat generation amount. The dissipation fin 7 may be formed on the electrically insulated base body 5 according to the joining by the adhesion agent etc. or may be formed integrally on the electrically insulated base body 5.

Also, for attaining the higher heat dissipation effect, it is desirable to have the heat dissipation body having a good thermal conductivity more than that of the semiconductor element 1. In particular, it is desirable to have the thermal conductivity for the heat dissipation body of above 160 W/mK.

As one material example for the heat dissipation body, there is an electrically insulated ceramics in which a main composition member thereof comprises an aluminum nitride, a silicon carbide, an aluminum oxide, and a beryllium oxide etc.. As one material example for the heat dissipation fin 7, it can use the above stated electrically insulated ceramics or a metallic ceramics.

The lead wire, which is connected to the input/output electrode portion of the semiconductor element 1 and is provided on a flexible insulated substance member. The flexible insulated substance member (the carrier film) 4 means that the lead wires are formed with the wiring patterns in which the electrical conductive substance such as copper is formed on polyimide film etc. according to the prior method such as a printing, a vapor deposition or an etching, for example.

The electrical connection for the carrier film 4 to the semiconductor element 1 and an outside terminal such as the wiring substrate (a circuit substrate) is carried out respectively through the formation of the solder bumps 3.

As the package member of the semiconductor device in the present invention, the insulated resin composition material is used. As the insulated resin composition material for the package member, an epoxy system resin composition material is used, such an epoxy system resin composition material is used generally as the package member for the semiconductor device.

In particular, as a filler material for the epoxy system resin composition material, silica and quartz glass etc. are blended. In particular, since the ball type fusion silica can be blended more than 80 wt. %, it is preferred because the thermal expansion coefficient is low and the crack hardly occurs at an adhesion boundary to the semiconductor element 1.

Also, the resin composition material having the low thermal expansion, except for the above resin composition material, or the rubber system resin composition material having the low young coefficient etc. may be used as the resin composition material for the package member in the present invention.

As the method for exposing the rear surface of the face in which the heat dissipation body is mounted on the semiconductor element 1 at the side of the face of the above stated package member, it is carried out according to the manufacturing process shown in the flow-charts in FIGS. 2A-2E.

Further, besides the package member using the resin composition material, the package member may be composed of the metallic material or the ceramics. In such a case, it is necessary to expose the rear surface of the heat dissipation body being mounted on the semiconductor element 1 at the side of face of the package member similar to that of the package member using the resin composition material.

In the present invention, the fixing means 9 for fixing the above stated package member to the wiring substrate is formed integrally on the package member, and the concrete example for the fixing means 9 will be explained in the latter stated various embodiments.

Since the carrier film 4 is used as the electrical connection means for connecting the input/output electrode portions of the semiconductor element 1 to the outside terminals (lead wires) of the package member, the number of the input/output electrode portions can be increased widely.

Since the rear surface of the heat dissipation body 7, in which the semiconductor element 1 is mounted, is exposed at the side of the face of the package member, the heat dissipation effect in the semiconductor element 1 having the large heat generation amount can be attained fully.

In particular, even the heat dissipation body comprises the large weighted dissipation fin structure, since the heat dissipation body can fixed to the circuit substrate to be mounted by the fixing means 9, a high fixing and supporting reliability can be obtained. By this structure, since no load for supporting the package member to the carrier film 4 is burdened, the reliability for the electrical connection can be heighten effectively.

Herein-after, the package structure type semiconductor device and the electronic apparatus using the package structure type semiconductor device in the present invention will be explained according to the concrete embodiments.

Embodiment 1

FIG. 1A is a cross-sectional schematic view showing a semiconductor device having a package structure according to the present invention.

FIG. 1B is an upper face view in the state in which a dissipation fin 7 is removed from the above stated FIG. 1A.

A semiconductor element 1 comprising a silicon chip is fixed to an electrically insulated base body 5 with an adhesion layer 2. In this embodiment, the electrically insulated base body 5 comprises an electrical insulated heat dissipation body comprising an aluminum nitride (AlN) sintering body. The thermal expansion coefficient of the AlN sintering body is $3.4 \times 10^{-6}/°$ C., and is closely to the thermal expansion coefficient of the silicon chip which comprises the semiconductor element 1.

The AlN sintering body has hardly the occurrence of the thermal stress and is superior as the base body for mounting the semiconductor element 1. In particular, even a chip area of the large scale semiconductor element 1 is of more than 100 mm$^2$, a joining reliability thereof can be obtained fully.

Further, since the thermal conductivity of the AlN sintering body has a large value of 200 W/mK, it is possible to transfer a heat, which generates during an operation of the semiconductor element 1, to the heat dissipation fin 7 which is made of a metallic material of aluminum and copper etc. or a high thermal conductivity ceramics etc., so that the semiconductor device having a high heat dissipation characteristic property can be obtained. For this reason, it is possible to mount the semiconductor element 1 having the heat generation amount of more than 5 W.

Besides, in this embodiment, AlN material is used as the electrically insulated base body 5, however it may use a silicon carbide (SiC) sintering body having a high thermal conductivity. SiC sintering body has the extremely high thermal expansion coefficient of $3.7 \times 10^{-6}/°$ C. and the extremely high thermal conductivity of 270 W/mK, therefore the thermal resistance thereof can be made small. In particular, it is superior in the mechanical strength, the water-proof, and the chemical resistance, and it is superior as a base body material for the semiconductor element 1.

As the base body material, besides of the above stated materials, the electrically insulated material having the thermal expansion coefficient similar to that of silicon and the thermal conductivity of more than 160 W/mK may be used.

In the present invention, a rear surface of the semiconductor element mounting face of the electrically insulated base body 5 is constituted so as to expose toward a surface of the package member. The heat dissipation fin 7 is formed corresponding to the heat generation amount of the semiconductor element 1. In such a case, the heat dissipation fin 7 may be formed integrally with the electrically insulated base body 5 or the separately formed dissipation fin may be joined to the rear surface of the electrically insulated base body 5 as shown in FIG. 1A.

Further, since about half portion of the surface of the package member is formed by ceramics, it is superior in the damp-proof in comparison with the package member being formed wholly by the resin composition material.

Input/output electrode portions, which are formed in the surface of the semiconductor element 1, are connected electrically to inner ends of the printing pattern (lead wire), which are formed on the carrier film 4, through the solder bumps 3.

As a method for electrically connecting the input/output electrode portions on the semiconductor element 1 and the lead wires of the carrier film 4 through the solder bumps 3, there has been known an CCB method (Control Collapse Bonding : U.S. Pat. No. 3,429,040). This method is the electrically connecting method in which, so as to not flow out the fused solder, the electrical connection between the semiconductor element 1 and the carrier film 4 is carried out by the solder having a ball shaped and a constant dimension.

Further, the other outer ends of the printing pattern (lead wire), which are formed on the carrier film 4, is made to appear the outside of the package member, so that the package structure is formed by encapsulating a resin composition material 8 with which the semiconductor element 1 is encapsulated integrally.

By using the carrier film 4, it is possible to provide the semiconductor device having a large number (more than 400) of the input/output electrode portions of the semiconductor element 1.

The carrier film 4, which is extruded toward the outside of the package structure, is connected to the input/output terminals of the circuit substrate on which the package structure is mounted.

Since the above stated carrier film 4 has a low dielectric conductivity lower than that of the material in which a metallic thin film wiring is formed on the ceramics, there is few the delay in the propagation time on the electrical signal.

The fixing means 9 in FIG. 1A and FIG. 1B are one example showing a fixing means for fixing the package member to another circuit substrate on which the above stated package structure is mounted.

Through holes 9a provided on the fixing means 9, the mechanical fixing is carried out to fix to the circuit substrate by the screw fixing etc.. Further, as a fixing method, besides the above stated screw fixing, it may fix through the adhering method using the adhesion agent. As the above stated adhesion agent, it can use an epoxy system resin composition material.

The lead frame in the conventional semiconductor device serves as the electrically connection and the supporting and fixing for the semiconductor device. There is the possibility of the reliability on the electrically connection because that the outside force adds to the package structure or, in case of the large weighted package member having the heat dissipation fin, the large burden force adds to the electrical portion.

However, in the package member of the present invention, the unnecessary force does not add to the wiring pattern portion by the provision of the fixing means 9. Accordingly, the number of the input/output electrode portions can increase enough this part.

Further, since the fixing means 9 are formed to extrude toward the outer side from the outer end portion of the carrier film 4, there has an effect for protecting the damage at the bent break-down etc. of the wiring pattern portion and thereby the handling can be improved.

Next, one example of the manufacturing processes for the semiconductor device according to the present invention is shown in FIGS. 2A-2E.

Figure 2A:
FIG. 2A is a manufacturing process showing one embodiment of a semiconductor device according to the present invention, in which a semiconductor element is fixed to an insulated base body.

Process (1) shown in FIG. 2A: The semiconductor element 1 is fixed by an Au/Si solder to the electrically insulated base body 5 in which the surface thereof is polished to be flat. Further, the solder excluding the Au/Si solder may employ, however, it may use as the solder which has a higher melting temperature point than that of the solder bump 3.

Figure 2B:
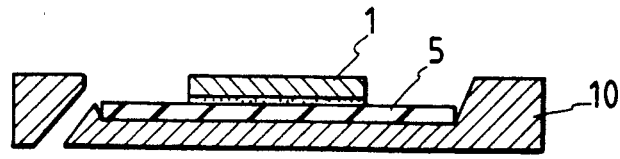
FIG. 2B is a manufacturing process showing one embodiment of a semiconductor device according to the present invention, in which a semiconductor element and an insulated base body are inserted into a lower mold.

Process (2) shown in FIG. 2B: The rear surface of the electrically insulated base body 5, on which the semiconductor element 1 is mounted, is inserted into a lower portion mold 10 for encapsulating the resin composition material so as to expose toward the surface of the package structure after the resin composition material encapsulating.

Figure 2C:
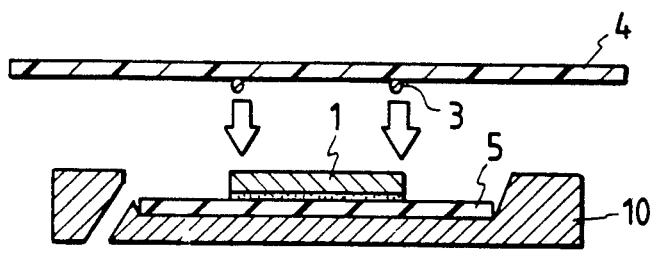
FIG. 2C is a manufacturing process showing one embodiment of a semiconductor device according to the present invention, in which a carrier film being formed solder bumps is connected to a semiconductor element.

Process (3) shown in FIG. 2C: The carrier film 4 has a patterning wiring fitted to the input/output electrode portion disposition of the semiconductor element 1 in advance, and the solder bump 3, which is formed at the inner end lead wire portion of the carrier film 4, is connected to put a position with the input/output electrode portion of the semiconductor element 1 together by the solder bumps 3 through heating and melting.

In this case, as the solder for the solder bump 3, it uses a solder having a melting temperature to not remelt the Au/Si solder, by which the above stated semiconductor element 1 is adhered to the electrically insulated base body 5. The electrical connection may be carried out before the insertion to the lower portion mold 10.

Figure 2D:
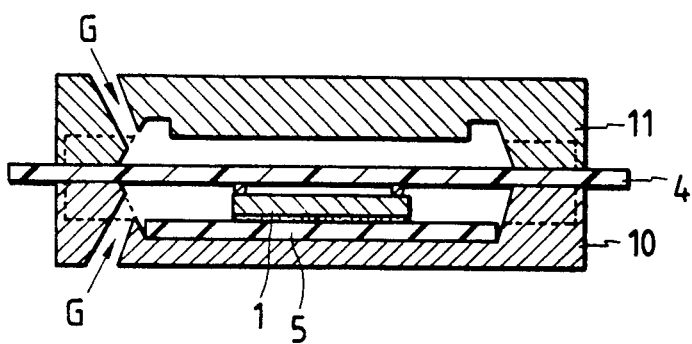
FIG. 2D is a manufacturing process showing one embodiment of a semiconductor device according to the present invention, in which a semiconductor element, an insulated base body and a carrier film are inserted into between a lower mold and an upper mold, and an encapsulating resin composition material is filled between both molds.

Process (4) shown in FIG. 2D: The upper portion mold 11 for encapsulating the resin composition material 8 is installed, and the encapsulating resin composition material 8 is filled up into a mold being constituted of the upper portion mold 11 and the lower portion mold 10 through an injecting port G. The filling up of the resin composition material 8 is carried out through the ordinary transfer molding method. Further, when the injecting resin composition material 8 is a liquid state, it is carried out through the potting method.

In this molding process by the encapsulating resin composition material 8, the fixing means 9 are formed integrally with the package member. In this embodiment of the present invention, the four fixing means 9 having the through holes 9a are formed at the four corners portions of the package member. The four fixing means 9 extend respectively toward the diagonal line. (see FIG. 1B).

Figure 2E:
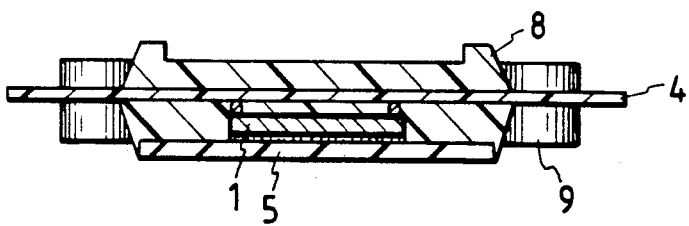
FIG. 2E is a manufacturing process showing one embodiment of a semiconductor device according to the present invention, in the state in which both molds are removed.

Process (5) shown in FIG. 2E: After the resin composition material 8 is heated at a predetermined temperature and is harden, by the removal of the molds 10 and 11 the resin composition material package structure type semiconductor device according to the present invention can be obtained.

Figure 3:
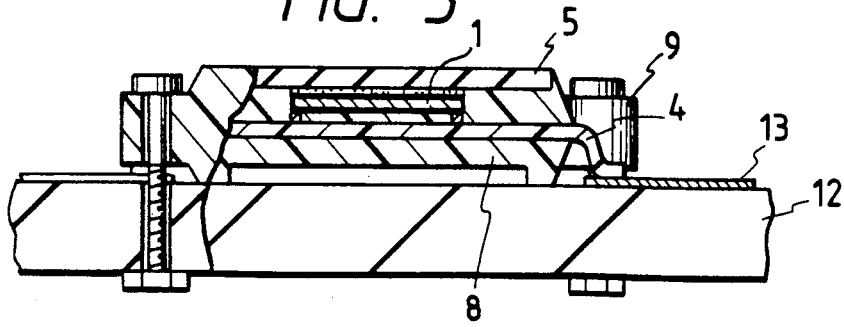
FIG. 3 is a cross-sectionally schematic view showing an installation condition for a semiconductor device, which is obtained according to the manufacturing processes shown in FIGS. 2A–2E, to a circuit substrate.

The semiconductor device obtained through the above stated processes, as shown in FIG. 3, is held temporarily at a predetermined position on a circuit substrate 12 and the fixing means 9 are fixed through the through hole 9a to the circuit substrate 12 by means of the screw. The outer end portion of the carrier film 4 is bent toward a side of the circuit substrate 12 and the electrically connection is obtained on a wiring pattern portion 13 on the circuit substrate 12, which is provided on the circuit substrate 12, by the solder etc..

In the above stated manufacturing processes, since the semiconductor element 1 is fixed to the electrically insulated base body 5 and further the carrier film 4 is sandwiched by the molds 10 and 11, the movement of the semiconductor element 1 and the carrier film 4 do not occur through the injection of the encapsulating resin composition material 8, therefore the electrical connection between the semiconductor element 1 and the carrier film 4 does not damaged.

After the package structure assembly, the cooling (dissipation) fin 7 is joined by the adhesion agent and the solder etc. to the electrically insulated base body 5 which exposes toward the surface of the package member.

Since the package member is fixed to the circuit substrate 12 through the fixing means 9, no force is added to the carrier film 4 for connecting the package member and the circuit substrate 12. Accordingly, it is possible to employ the heavy weight metallic fin member comprising such as copper.

Embodiment 2

Figure 4:
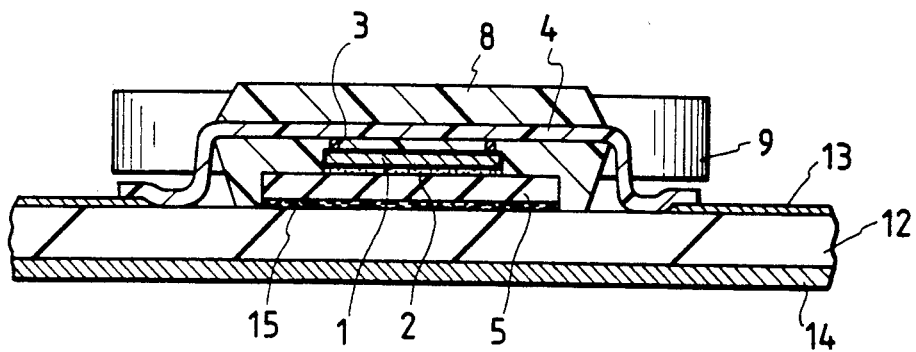
FIG. 4 is a cross-sectionally schematic view showing another embodiment of a semiconductor device according to the present invention.

FIG. 4 is a cross-sectional schematic view showing another semiconductor device. A resin composition encapsulating type is semiconductor device having the package structure shown similar to the above stated Embodiment 1. The rear surface exposed from the package member of the electrically insulated base body 5, on which the semiconductor element 1 is mounted, is fixed toward a side of the circuit substrate 12.

When the package member is mounted on the circuit substrate 12, a filling-up agent 15 such as the thermal conductive grease is applied to the surface of the exposed electrically insulated base body 5 and the package member is adhered to the circuit substrate 12. Thereby, the heat generated in the semiconductor element 1 is diffused to the circuit substrate 12 through the electrically insulated base body 5 and the heat is dissipated from the rear surface of the circuit substrate 12.

In this case, it is preferred to provide a number of the metal layers or the metal layer having a high metal volume percent on the circuit substrate 12 so that the heat can be spread widely. Further, a copper plate 14 as the heat dissipation plate is provided closely to the rear surface of the circuit substrate 12, the heat dissipation effect can be heighten moreover. Further, it is possible to provide further a heat dissipation means, if necessary.

Similar to the above stated Embodiment 1, the package member is fixed to the circuit substrate 12 through the fixing means 9 which are mounted separately against the wiring pattern portion.

Further, as the thermal conductive grease, it may be used the grease to which the powder comprising a metal, an aluminum and a SiC (silicon carbide) etc. is blended.

Embodiment 3

Figure 5:
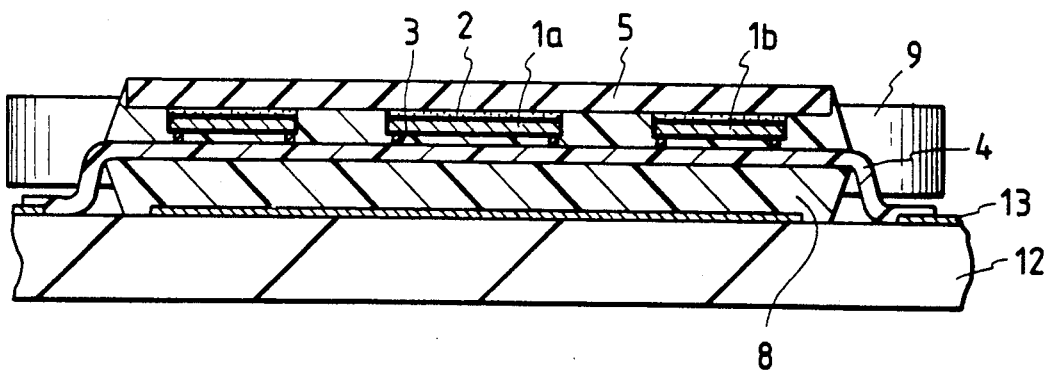
FIG. 5 is a cross-sectionally schematic view showing a further embodiment of a semiconductor device according to the present invention.

FIG. 5 is a cross-sectional schematic view showing another semiconductor device, similar to the Embodiment 1, the resin composition encapsulating type semiconductor device having the package structure is shown.

A plurality of the semiconductor elements 1a and 1b are mounted on the electrically insulated base body 5. The heat generation amount in each of the semiconductor element 1a and 1b may differ by the respective semiconductor element. It is desirable to dispose the semiconductor element 1a having the largest heat generation amount, for example a logic LSI (Large Scale Integration), at a central portion of the package structure and to dispose the semiconductor elements 1b having the smallest heat generation amount, for example an DRAM (Dynamic Random Access Memory), at a peripheral portion of the package structure.

Since the plurality of the semiconductor elements 1a and 1b are received in the single package member and are connected through the carrier film 4, the number of the input/output electrode portions of the semiconductor elements 1a and 1b can be made small toward the outside of the package member, further the propagation delay in the electrical signal across between the package structure can be small.

Comparing to the conventional wiring method using the wire bonding method, the packaged wiring through the carrier film 4 can be manufactured easily and it is superior in the quality control aspect.

In this embodiment of the present invention, the surface of the electrically insulated base body 5 is exposed on the surface of the package member, and the fixing means 9 is formed integrally with the resin composition material 8.

In this embodiment of the present invention, the electrically insulated base body 5 having the wide area is used so as to mount the plurality of the semiconductor elements 1a and 1b. For this reason, the size of the package structure is made large and heavy. However, by the provision of the fixing means 9, the fixing means 9 are fixed to the circuit substrate 12, accordingly an unnecessary outside force does not add on the carrier film 4, and the reliability for the electrical connection can be heightened.

Embodiment 4

Figure 6:
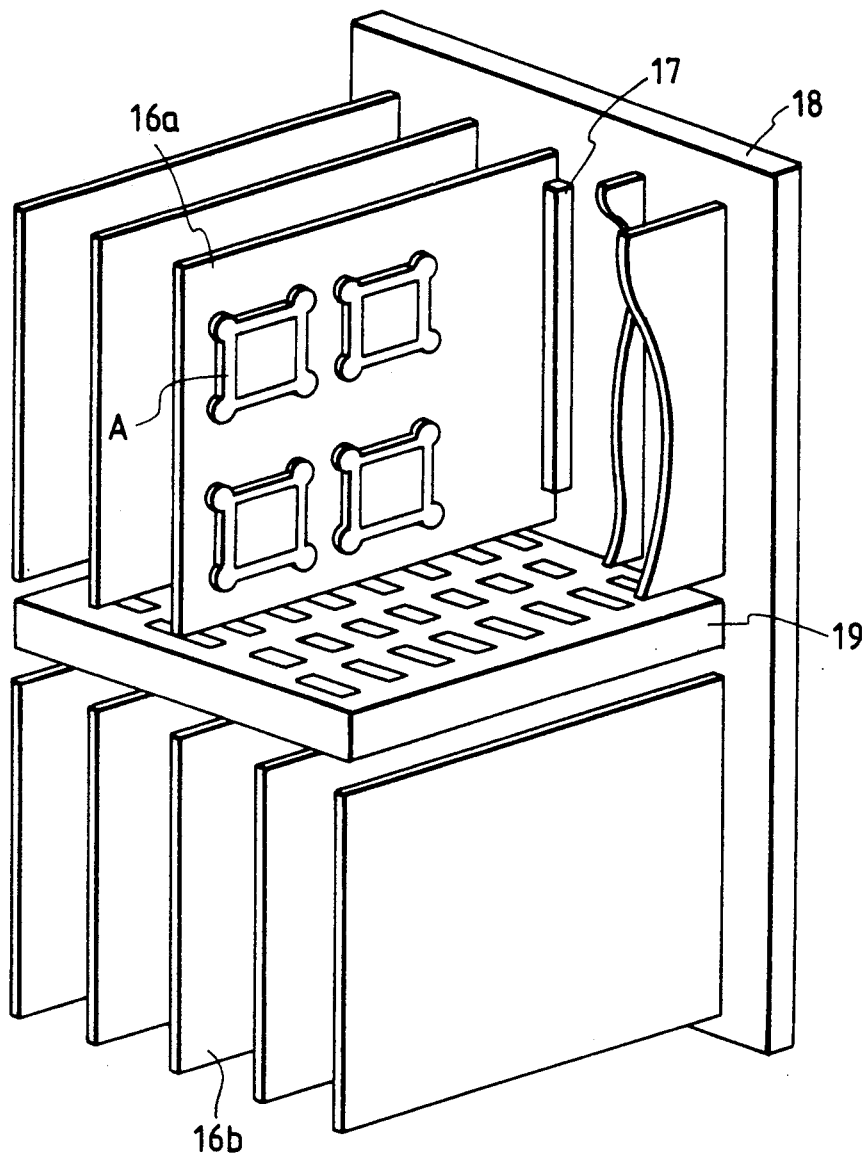
FIG. 6 is a cross-sectionally schematic view showing one embodiment of an electronic computer using semiconductor devices according to the present invention.

FIG. 6 is a schematic perspective view in which the semiconductor devices according to the present invention are installed practically to the electronic computer.

The semiconductor devices A shown in the above stated Embodiments are mounted with necessary numbers on plug-in card 16a or 16b which is formed respectively by a multilayer circuit substrate. The plug-in card 16a and 16b are connected to a back board 18 through a connector means 17.

In this practical installation, it is constituted of two stages comprising an upper portion plug-in card 16a group and a lower portion plug-in card 16b group. By a blower (not shown) provided on a lower portion of a casing of the computer, a cool air cools semiconductor devices A which are mounted on the lower portion plug-in card 16b group, and passes through a cross-flow board 19, and thereafter cools the semiconductor devices A which are mounted on the upper portion plug-in card 16a group.

Figure 7:
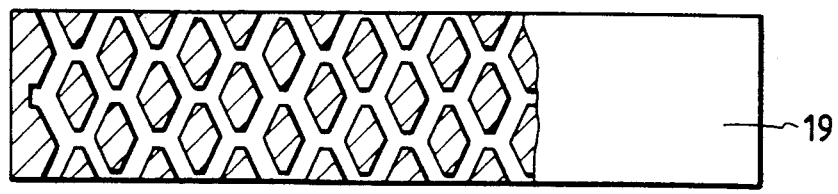
FIG. 7 is a partially cross-sectional view showing one embodiment of a cross-flow board using in the electronic computer shown in FIG. 6.

FIG. 7 is a partially cross-sectional schematic view showing the above stated cross-flow board 19. The cross-flow board 19 adjusts the non-uniformity in the temperature distribution of the cool air caused by cooling of the semiconductor devices A, which are mounted on the lower portion plug-in card 16b group, and send toward the upper portion plug-in card 16a group.

Further, by the provision of another system duct in the cross-flow board 19, the refrigerant or the cool air passes through, and then the cross-flow board 19 is cooled. Therefore, it can cool effectively the semiconductor devices A which are mounted on the upper portion plug-in card 16a group.

Further, as the semiconductor devices A, the logic package structure type semiconductor device, an VR (Vector Resistor) package structure type semiconductor device, the main memory package structure type semiconductor device, and the extension memory package structure type semiconductor device are mounted on the high integration logic plug-in card.

As the logic package structure type semiconductor device, such a logic LSI (Large Scale Integration), VRLSI (Vector Resistor Large Scale Integration) are used, as the main memory package structure type semiconductor device, such an MS (Main Storage) module is used and as the extension memory package structure type semiconductor device, such an DRAM (Dynamic Random Access Memory) is used, respectively. These package structure type semiconductor devices are mounted on the circuit substrate through the surface practical installation method, the axial practical installation method, and the both sides practical installation method etc..

According to this embodiment of the present invention, it can obtain the electronic computer having a small size and a large capacity compared with the conventional electronic computer.

Embodiment 5

Figure 8A:
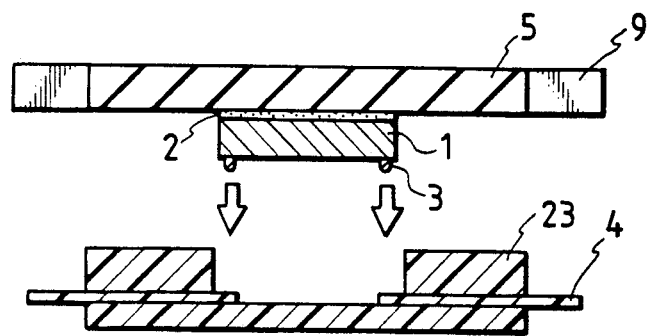
FIG. 8A is a cross-sectionally schematic view showing an installation method for another embodiment of a semiconductor device according to the present invention.
Figure 8B:
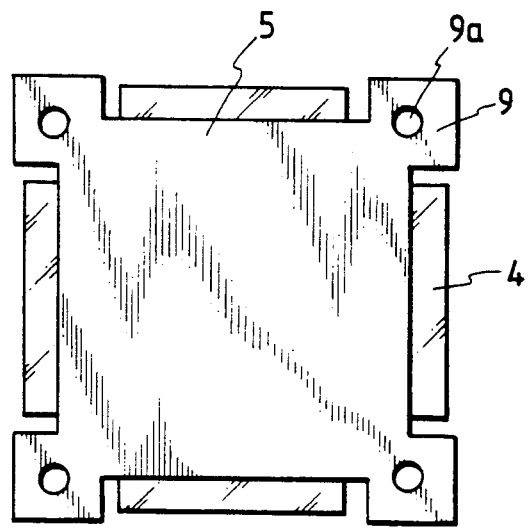
FIG. 8B is a top view showing another embodiment of the semiconductor device shown in FIG. 8A.

FIG. 8A is a cross-sectional schematic view showing the assembly method for another semiconductor device having the package structure, and FIG. 8B is a top view thereof.

The semiconductor element 1 is fixed on the electrically insulated base body 5 similar to the Embodiment 1. The wiring pattern is formed on the carrier film 4 in advance and is connected to each of the input/output electrode portions of the semiconductor element 1 through the solder bumps 3, and the package member is constituted of an insulated cap 23 comprising the organic composition material such as an epoxy resin system composition material.

In this embodiment of the present invention, the surface of the electrically insulated base body 5 is exposed on the surface of the package member, and the fixing means 9 having the through hole 9a is formed integrally with the insulated base body 5.

Further, it is fixed to another circuit substrate through the fixing means 9 which are formed on one part of the insulated base body 5 in advance.

Embodiment 6

Figure 9:
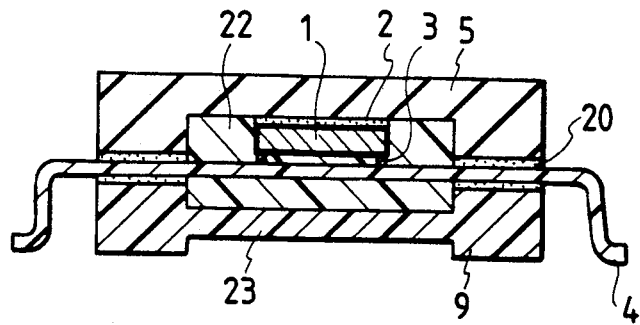
FIG. 9 is a cross-sectionally schematic view showing an installation method for a further embodiment of a semiconductor device according to the present invention.

FIG. 9 is a cross-sectional schematic view showing another semiconductor device having the package structure.

The semiconductor element 1 is fixed on the electrically insulated base body 5 similar to the Embodiment 1 and has the electrical connection with the inner end (lead wire) portion of the carrier film 4.

In this embodiment of the present invention, the surface of the electrically insulated base body 5 is exposed on the surface of the package member, and the fixing means 9 is formed integrally with the insulated cap 23.

The semiconductor element 1 is covered by a gel member 22 so as to improve the damp-proof. The insulated cap 23 having the fixing means 9 to the circuit substrate is joined and encapsulating by an organic system adhesion agent 20. Since the electrically insulated base body 5 and the insulated cap 23 are constituted of ceramics, it is superior in the damp-proof as compared with the resin composition material package structure type semiconductor device.

Embodiment 7

Figure 10:
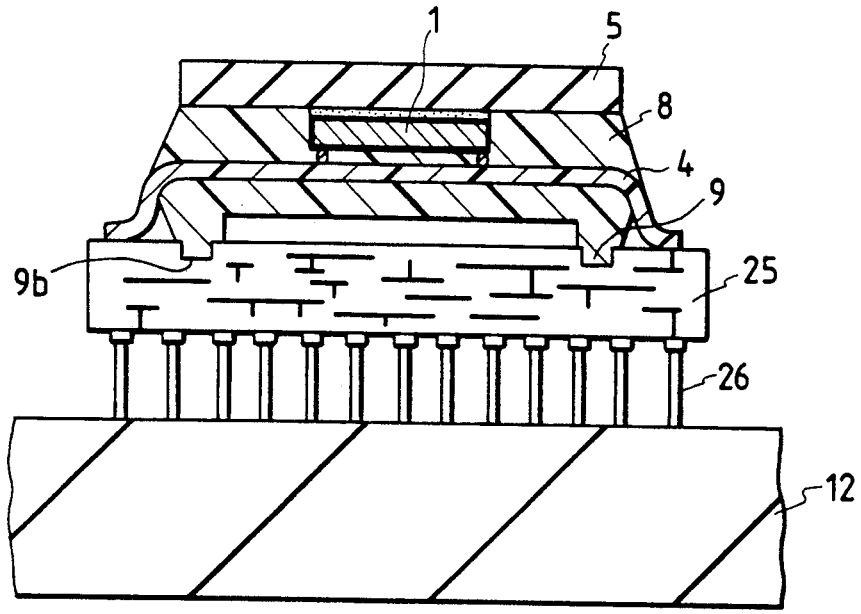
FIG. 10 is a cross-sectionally schematic view showing an installation method for a further embodiment of a semiconductor device according to the present invention.

FIG. 10 is a cross-sectional schematic view showing another semiconductor device having the package structure.

The semiconductor element 1 is fixed on the electrically insulated base body 5 similar to the Embodiment 1 and has the electrical connection with the carrier film 4.

In this embodiment of the present invention, the surface of the electrically insulated base body 5 is exposed on the surface of the package member, and the fixing means 9 is formed integrally with the resin composition material 8.

The package member has the convex shape fixing means 9 and is fixed tightly through inserting into concave portions 9b which are provided at the corresponding portion of a wiring enlargement substrate 25.

The wiring pattern is enlarged in the wiring enlargement substrate 25 and connected to a plurality of pins 26 as the input/output electrode portions, which are disposed in the rear surface of the wiring enlargement substrate 25. The pins 26 are connected by inserting to a predetermined portion in the circuit substrate 12.

In this embodiment of the present invention, in case that there are many input/output electrode portions of the semiconductor element 1, so as to make small the size of the package member, it is desirable to make narrow the wiring space of the electric wiring pattern in the carrier film 4.

However, in a case that the wiring space of the electric wiring pattern in the carrier film 4 is narrow, there happens a difference between the wiring space of the electric wiring pattern of the carrier film 4 and the wiring space of the electric wiring pattern which is formed on the circuit substance 12 for connecting the carrier film 4.

In a case that there is a difference between the wiring space of the carrier film 4 and the wiring space of the circuit substrate 12, then the carrier film 4 and the circuit substrate 12 are connected each other, the wiring space of the electric wiring pattern of the carrier film 4 can adjust to meet the wiring space of the electric wiring pattern of the circuit substrate 12 utilizing the wiring enlargement substrate 25 according to this embodiment of the present invention.

Further, it has a good compatibility by mounting the circuit substrate 12 through the pins 26.

Embodiment 8

Figure 11:
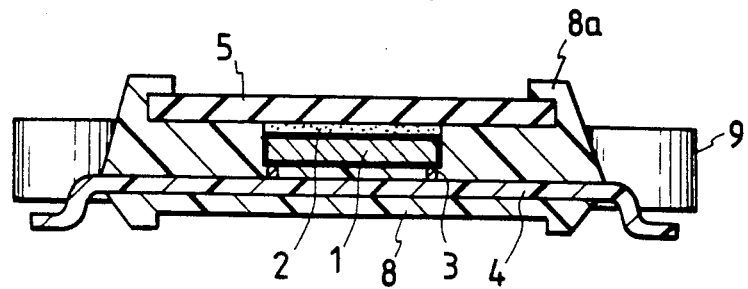
FIG. 11 is a cross-sectionally schematic view showing an installation method for a further embodiment of a semiconductor device according to the present invention.

FIG. 11 is a cross-sectional schematic view showing another semiconductor device having the package structure.

The semiconductor element 1 is fixed on the electrically insulated base body 5 similar to the Embodiment 1 and has the electrical connection with the wiring which is formed on the carrier film 4.

In this embodiment of the present invention, the surface of the electrically insulated base body 5 is exposed on the surface of the package member, and the fixing means 9 is formed integrally with the resin composition material 8.

At the peripheral edge portion in the electrically insulated base body 5 of the semiconductor device according to this embodiment, the encapsulating resin composition material 8 having an ⊐ shape portion 8a is formed. Therefore, there is no possibility that the electrically insulated base body 5 may come off from the package member.

Embodiment 9

Figure 12A:
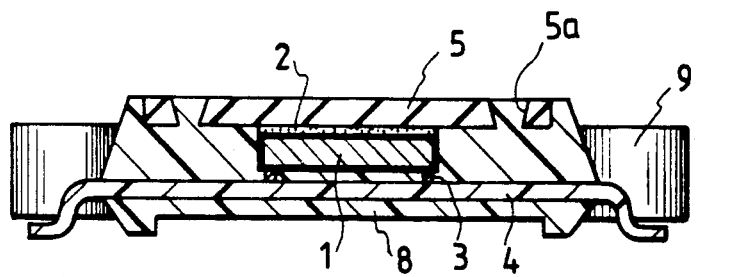
FIG. 12A is a cross-sectionally schematic view showing an installation method for a further embodiment of a semiconductor device according to the present invention.

FIG. 12A is a cross-sectional schematic view showing another semiconductor device having the package structure.

The semiconductor element 1 is fixed on the electrically insulated base body 5 similar to the Embodiment 1 and has the electrical connection with the carrier film 4.

In this embodiment of the present invention, the surface of the electrically insulated base body 5 is exposed on the surface of the package member, and the fixing means 9 is formed integrally with the resin composition material 8.

Figure 12B:
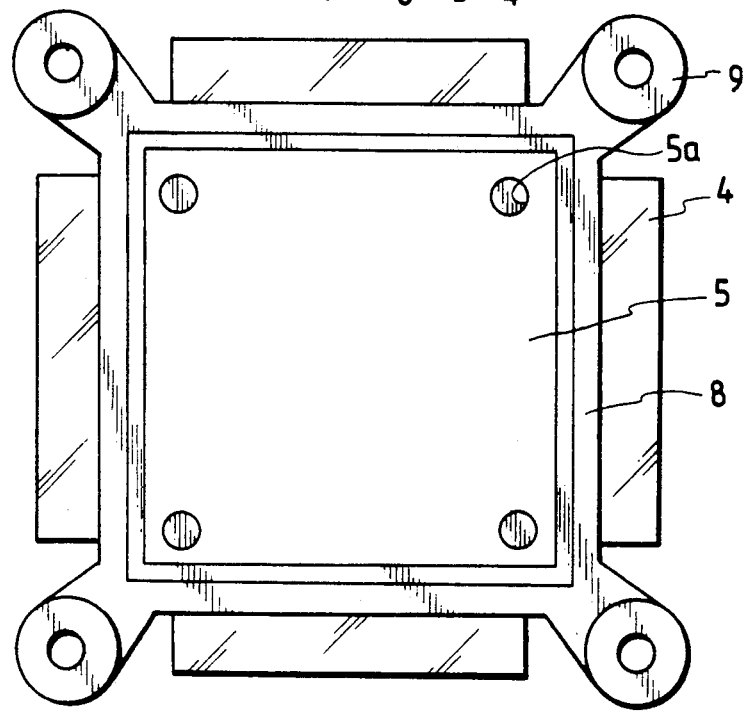
FIG. 12B is a top view showing one embodiment of the semiconductor device shown in FIG. 12A.

In this semiconductor device of this embodiment of the present invention, a plurality of penetrating holes 5a are formed on parts of the electrically insulated base body 5 as shown in FIG. 12B. The resin composition material 8, which has inserted in these penetrating holes 5a, has the anchor effect, so that there is no possibility that the electrically insulated base body 5 may come off the package member.

Embodiment 10

Figure 13:
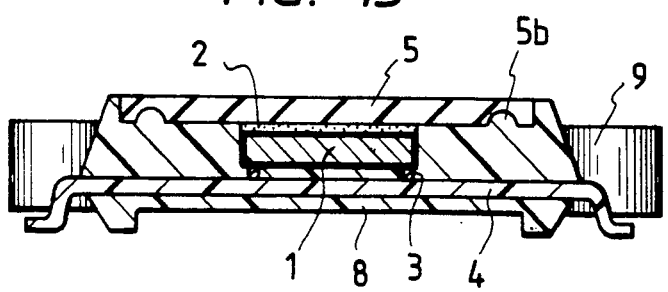
FIG. 13 is a cross-sectionally schematic view showing an installation method for a further embodiment of a semiconductor device according to the present invention.

FIG. 13 is a cross-sectional schematic view showing another semiconductor device having the package structure.

In this embodiment of the present invention, the surface of the electrically insulated base body 5 is exposed on the surface of the package member, and the fixing means 9 is formed integrally with the resin composition material 8.

A plurality of concave portions 5b are formed at parts of the semiconductor element mounting face of the electrically insulated base body 5 in the semiconductor device. The resin composition material 8, which has inserted in these concave portions 5b, has the anchor effect, therefore there is no possibility that the electrically insulated base body 5 may come off from the package member.

Embodiment 11

Figure 14:
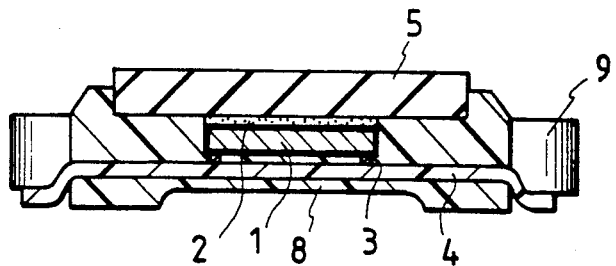
FIG. 14 is a cross-sectionally schematic view showing an installation method for a further embodiment of a semiconductor device according to the present invention.

FIG. 14 is a cross-sectional schematic view showing another semiconductor device having the package structure.

In this embodiment of the present invention, the surface of the electrically insulated base body 5 is exposed on the surface of the package member, and the fixing means 9 is formed integrally with the resin composition material 8.

Since the thickness of the electrically insulated base body 5 of the semiconductor device is made thick, it has a large heat dissipation effect because that the heat from the semiconductor element 1 is diffused fully in the electrically insulated base body 5.

Embodiment 12

Figure 15:
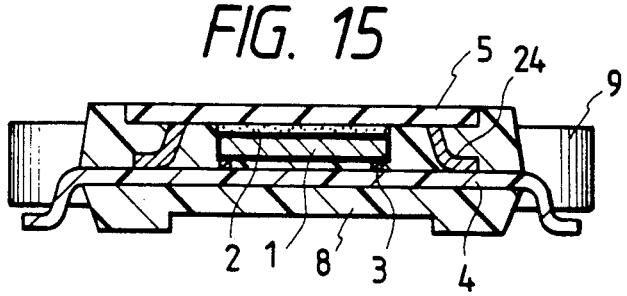
FIG. 15 is a cross-sectionally schematic view showing an installation method for a further embodiment of a semiconductor device according to the present invention.

FIG. 15 is a cross-sectional schematic view showing another semiconductor device having the package structure.

In this embodiment of the present invention, the surface of the electrically insulated base body 5 is exposed on the surface of the package member, and the fixing means 9 is formed integrally with the resin composition material 8.

A metal layer is formed by the metallization at a face of the side of the semiconductor element 1 of the electrically insulated base body 5 in the semiconductor device.

This metal layer is connected by a lead wire 24 for grounding which is formed on the carrier film 4. By this structure, it can obtain the semiconductor device having a stable characteristic against the voltage fluctuation etc..

Further, a metal plate, in which the face of the side of the semiconductor element 1 is processed insulatedly, may use in replace of the electrically insulated base body 5.

Figure 16:
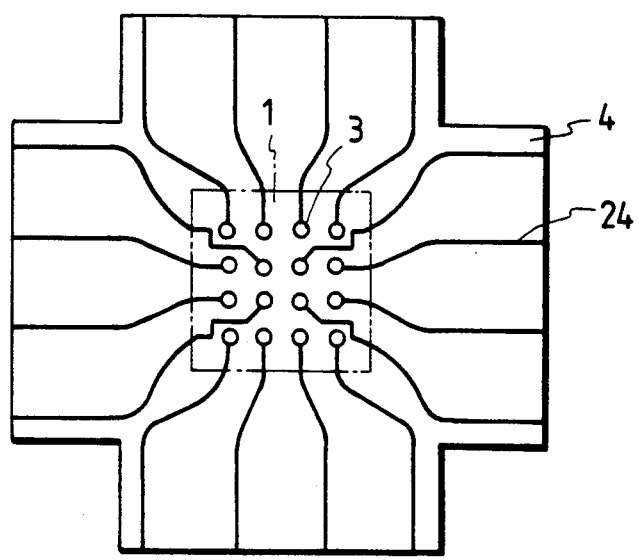
FIG. 16 is a plan view showing one embodiment of a carrier film.

Besides, one example of the carrier film 4 used in this embodiment is shown in FIG. 16.

Fitting to the input/output electrode portions of the surface of the semiconductor element 1, the carrier film 4 forming the wiring pattern has the electrode pads corresponding the solder bumps 3 which are arranged regularly on the surface of the semiconductor element 1.

Further, the carrier film 4 may be made of the multi-layer wiring structure.

Embodiment 13

Similar to the Embodiment 1, the semiconductor element is fixed to the electrically insulated base body, the fixing for the circuit substrate of the package member in the semiconductor device having the electrical connection with the wiring pattern, which is formed on the carrier film, is carried out a resin composition material system adhesion agent.

In the above stated embodiment, it carries out easily in the manufacture aspect in comparison with the screw-setting method for the fixing means 9 in the Embodiment 1.

What is claimed is:

1. A semiconductor device having a package structure comprising a heat dissipation body, a semiconductor element being mounted on a first portion of said heat dissipation body, said semiconductor element having input/output electrode portions, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, wherein a second portion of said heat dissipation body is exposed on a surface of said package member, said package member has a fixing means, which is integral with said package member and separate from said flexible insulated substance member, for fixing said package member to a wiring substrate, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

2. A semiconductor device having a package structure comprising a heat dissipation body, a semiconductor element being mounted on said heat dissipation body, said semiconductor element having input/output electrode portions, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, wherein said package member is formed to dissipate heat caused by an operation of said semiconductor element through said heat dissipation body, said package member has a fixing means, which is integral with said package member and separate from said flexible insulated substance member, for fixing said package member to a wiring substrate, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

3. A semiconductor device having a package structure comprising an electrically insulated base body, a semiconductor element being mounted on a first portion of said electrically insulated body, said semiconductor element having input/output electrode portions, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, wherein a second portion of said electrically insulated base body is exposed on a surface of said package member, said package member has a fixing means, which is integral with said package member and separate from said flexible insulated substance member, for fixing said package member to a wiring substrate, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

4. A semiconductor device having a package structure comprising an electrically insulated base body, a semiconductor element being mounted on a first portion of said electrically insulated base body, said semiconductor element having input/output electrode portions, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, wherein
 a second portion of said electrically insulated base body is exposed on a surface of said package member, said electrically insulated body has a dissipation fin member, said dissipation fin member is mounted on a surface of said electrically insulated base body, said package member has a fixing means, which is integral with said package member and separate from said flexible insulated substance member and from said dissipation fin member, for fixing said package member to a wiring substrate, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

5. A semiconductor device having a package structure comprising an electrically insulated base body, a semiconductor element being mounted on a first portion of said electrically insulated base body, said semiconductor element having input/output electrode portions, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, wherein
 a second portion of said electrically insulated base body is exposed on a surface of said package member, said package member has a fixing means, separate from said flexible insulated substance member, for fixing said package member to a wiring substrate, said fixing means is formed integrally with said package member, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

6. A semiconductor device having a package structure comprising an electrically insulated base body, said electrically insulated base body having a thermal conductivity of above 160 W/mK at a room temperature, a semiconductor element being mounted on said electrically insulated base body, said semiconductor element having input/output electrode portions, said semiconductor element having a heat generation amount of above 5 W, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, wherein
 said electrically insulated base body has a dissipation fin member, and said dissipation fin member is mounted on a surface of said electrically insulated base body, whereby said dissipation fin member cools said semiconductor element so as to maintain a temperature of below 85° C. during an operation of said semiconductor element, and said package member has a fixing means, which is integral with said package member and separate from said flexible insulated substance member, for fixing said package member to a wiring substrate, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

7. A semiconductor device having a package structure comprising a heat dissipation body, a semiconductor element being mounted on a first portion of said heat dissipation body, said semiconductor element having input/output electrode portions, a package member for packaging said semiconductor element, said package member being comprised of an insulated resin composition material, a flexible insulated substance member being inserted into said package member, and said flexible insulated substance member having lead wires, each of said input/output electrode portions of said semiconductor element being connected electrically to each of said lead wires of said flexible insulated substance member, wherein
 a second portion of said heat dissipation body is exposed on a surface of said package member, said package member has a fixing means, separate from said flexible insulated substance member, for fixing said package member to a wiring substrate, said fixing means is formed integrally with said package member, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

8. A semiconductor device having a package structure comprising a heat dissipation body, a semiconductor element being mounted on a first portion of said heat dissipation body, said semiconductor element having input/output electrode portions, a package member for packaging said semiconductor element, said package member being comprised of an insulated resin composition material, a flexible insulated substance member being inserted into said package member, and said flexible insulated substance member having lead wires, each of said input/output electrode portions of said semiconductor element being connected electrically to each of said lead wires of said flexible insulated substance member, wherein
a second portion of said heat dissipation body is exposed on a surface of said package member, said heat dissipation body further has a dissipation fin member, said package member has a fixing means, separate from said flexible insulated substance member and from said dissipation fin member, for fixing said package member to a wiring substrate, said fixing means is formed integrally with said package member, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

9. A semiconductor device having a package structure comprising a heat dissipation body, a semiconductor element being mounted on a first portion of said heat dissipation body, said semiconductor element having input/output electrode portions of above 400, said semiconductor element having a heat generation amount of above 5 W, package member for packaging said semiconductor element, said package member being comprised of an insulated resin composition material, a flexible insulated substance member being inserted into said package member, and said flexible insulated substance member having lead wires, each of said input/output electrode portions of said semiconductor element being connected electrically to each of said lead wires of said flexible insulated substance member, wherein
a second portion of said heat dissipation body is exposed on a surface of said package member and said heat dissipation body further has a dissipation fin member, said package member has a fixing means, separate from said flexible insulated substance member and from said dissipation fin member, for fixing said package member to a wiring substrate, said fixing means is formed integrally with said package member, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

10. A semiconductor device having a package structure comprising an electrically insulated base body, said electrically insulated base body comprising at least one of an aluminum nitride sintering body, a silicon carbide sintering body, an aluminum oxide sintering body and a beryllium oxide sintering body, said electrically insulated base body having a thermal conductivity of above 160 W/mK, a silicon chip member being mounted on a first portion of said electrically insulated base body, said silicon chip member having input/output electrode portions, a package member for packaging said silicon chip member, said package member being comprised of an epoxy system resin composition material, a carrier film member being inserted into said package member, and said carrier film member having lead wires, each of said input/output electrode portions of said silicon chip member being connected electrically to each of said lead wires of said carrier film member, wherein
a second portion of said electrically insulated base body is exposed on a surface of said package member, said package member has a fixing means, separate from said carrier film member, for fixing said package member to a wiring substrate, said fixing means is formed integrally with said package member, said wiring substrate is connected electrically to said lead wires of said carrier film member, said carrier film member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

11. A semiconductor device having a package structure according to claim 10, wherein
a dissipation fin member for dissipating a generation heat of said electrically insulated base body is provided on said electrically insulated base body.

12. A semiconductor device having a package structure according to claim 10,
wherein a filling agent is filled up between said electrically insulated base body and one surface of said wiring substrate.

13. A semiconductor device having a package structure according to claim 10, further comprising:
a metallic plate mounted on another surface of said wiring substrate.

14. A semiconductor device having a package structure comprising an electrically insulated base body, said electrically insulated base body comprising at least one of an aluminum nitride sintering body, a silicon carbide sintering body, an aluminum oxide sintering body and a beryllium oxide sintering body, said electrically insulated base body having a thermal conductivity of above 160 W/mK, a silicon chip member being mounted on one surface of said electrically insulated base body, said silicon chip member having input/output electrode portions, a package member for packaging said silicon chip member, said package member being comprised of an epoxy system resin composition material, a carrier film member being inserted into said package member, and said carrier film member having lead wires, each of said input/output electrode portions of said silicon chip member being connected electrically to each of said lead wires of said carrier film member, wherein a second portion of said electrically insulated base body is exposed on a surface of said package member, said package member has a fixing means, separate from said carrier film member, for fixing said package member to a wiring substrate, said fixing means is formed integrally with said package member, said wiring substrate is connected electrically to said lead wires of said carrier film member, said carrier film member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

15. A semiconductor device having a package structure according to claim 14, wherein a dissipation fin member for dissipating a generation heat of said electrically insulated base body is provided on said electrically insulated base body.

16. A semiconductor device having a package structure comprising an electrically insulated base body, said electrically insulated base body comprising at least one of an aluminum nitride sintering body, a silicon carbide sintering body, an aluminum oxide sintering body and a beryllium oxide sintering body, said electrically insulated base body having a thermal conductivity of above 160 W/mK, a silicon chip member being mounted on a first portion of said electrically insulated base body, said silicon chip member having input/output electrode portions, an insulated cap member for packaging said silicon chip member, a carrier film member being inserted between said insulated cap member and said electrically insulated base body, and said carrier film member having lead wires, each of said input/output electrode portions of said silicon chip member being connected electrically to each of said lead wires of said carrier film member, wherein a second portion of said electrically insulated base body is exposed on a surface of said insulated cap member, said insulated cap member has a fixing means, separate from said carrier film member, for fixing said insulated cap member to a wiring substrate, said fixing means is formed integral with said insulated cap member, said wiring substrate is connected electrically to said lead wires of said carrier film member, said carrier film member extends outside at least a first portion of said insulated cap member, and said fixing means extends outwardly from at least a second portion of said insulated cap member different than said first portion so that the mechanical fixing of said insulated cap member to said wiring substrate is independent of and separated from the electrical connection of said lead wires to said wiring substrate.

17. A semiconductor device having a package structure according to claim 16, wherein a dissipation fin member for dissipating a generation heat of said electrically insulated base body is provided on said electrically insulated base body.

18. A semiconductor device having a package structure comprising an electrically insulated base body, said electrically insulated base body comprising at least one of an aluminum nitride sintering body, a silicon carbide sintering body, an aluminum oxide sintering body and a beryllium oxide sintering body, said electrically insulated base body having a thermal conductivity of above 160 W/mK, a silicon chip member being mounted on a first portion of said electrically insulated base body, said silicon chip member having input/output electrode portions, an insulated cap member for packaging said silicon chip member, a carrier film member being inserted between said insulated cap member and said electrically insulated base body, and said carrier film member having lead wires, each of said input/output electrode portions of said silicon chip member being connected electrically to each of said lead wires of said carrier film member, wherein a second portion of said electrically insulated base body is exposed on a surface of said insulated cap member, said insulated cap member has a fixing means, separate from said carrier film member, for fixing said insulated cap member to a wiring substrate, said fixing means is formed integrally with said insulated cap member, said wiring substrate is connected electrically to said lead wires of said carrier film member, said carrier film member extends outside at least a first portion of said insulated cap member, and said fixing means extends outwardly from at least a second portion of said insulated cap member different than said first portion so that the mechanical fixing of said insulated cap member to said wiring substrate is independent of and separated from the electrical connection of said lead wires to said wiring substrate.

19. A semiconductor device having a package structure according to claim 18, wherein a dissipation fin member for dissipating a generation heat of said electrically insulated base body is provided on said electrically insulated base body.

20. A semiconductor device having a package structure comprising a heat dissipation body, a semiconductor element being mounted on a first portion of said heat dissipation body, said semiconductor element having input/output electrode portions, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, wherein a second portion of said heat dissipation body is exposed on a surface of said package member, said package member has a fixing means, which is integral with said package member and separate from said flexible insulated substance member, for fixing said package member to a wiring substrate, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

21. A semiconductor device having a package structure comprising a heat dissipation body, a semiconductor element being mounted on a first portion of said heat dissipation body, said semiconductor element having input/output electrode portions of above 400, said semiconductor element having a heat generation amount of above 5 W, package member for packaging said semiconductor element, said package member being comprised of an insulated resin composition material, a flexible insulated substance member being inserted into said package member, and said flexible insulated substance member having lead wires, each of said input/output electrode portions of said semiconductor element being connected electrically to each of said lead wires of said flexible insulated substance member, wherein a second portion of said heat dissipation body is exposed on a surface of said package member and said heat dissipation body has a fixing means, separate from said flexible insulated substance member, for fixing said package member to a wiring substrate, said fixing means is formed integrally with said package member, said wiring substrate is connected electrically to said lead wires of said flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

22. A semiconductor device having a package structure comprising an electrically insulated base body, said electrically insulated base body comprising at least one of an aluminum nitride sintering body, a silicon carbide sintering body, an aluminum oxide sintering body and a beryllium oxide sintering body, said electrically insulated base body having a thermal conductivity of above 160 W/mK, a silicon chip member being mounted on a first portion of said electrically insulated base body, said silicon chip member having input/output electrode portions, a package member for packaging said silicon chip member, said package member being comprised of an epoxy system resin composition material, a carrier film member being inserted into said package member, and said carrier film member having lead wires, each of said input/output electrode portions of said silicon chip member being connected electrically to each of said lead wires of said carrier film member, wherein a second portion of said electrically insulated base body is exposed on a surface of said package member, said electrically insulated base body has a fixing means, separate from said carrier film member, for fixing said package member to a wiring substrate, said fixing means is formed integral with said electrically insulated base body, said wiring substrate is connected electrically to said lead wires of said carrier film member, said carrier film member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

23. An electronic apparatus having a package structure type semiconductor device, said semiconductor device comprising a heat dissipation body, a semiconductor element mounted on a first portion of said heat dissipation body, said semiconductor element having input/output electrode portions, a package member for packaging said semiconductor element, a flexible insulated substance member being inserted into said package member, and said flexible insulated substance member having lead wires, each of said input/output electrode portions of said semiconductor element being connected electrically to each of said lead wires of said flexible insulated substance member, and said input/output electrode portions of said semiconductor element being connected electrically to a wiring substrate through said lead wires of said flexible insulated substance member, wherein a second portion of said heat dissipation body is exposed on a surface of said package member, and said package member is fixed to said wiring substrate through a fixing means which is integral with said package member, and said package member flexible insulated substance member, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

24. An electronic apparatus having a wiring substrate and a package structure type semiconductor device, said semiconductor device being packaged on said wiring substrate, and said semiconductor device comprising a heat dissipation body, a semiconductor element being mounted on said heat dissipation body, said semiconductor element having input/output electrode portions, a package member for packaging said semiconductor element, a flexible insulated substance member being inserted into said package member, said flexible insulated substance member having lead wires, each of said input/output electrode portions of said semiconductor element being connected electrically to each of said lead wires of said flexible insulated substance member, and said input/output electrode portions of said semiconductor element being connected electrically to said wiring substrate through said lead wires of said flexible insulated substance member, wherein said package member is fixed tightly to said wiring substrate, by a fixing means which is integral with said package member, and separated from said flexible insulated substance member, said heat dissipation body is disposed to dissipate a heat which is generated by an operation of said semiconductor element toward an outside of said package member, and said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

25. An electronic apparatus having a package structure type semiconductor device, said semiconductor device comprising a heat dissipation body, a semiconductor element mounted on a first portion of said heat dissipation body, said semiconductor element having input/output electrode portions, a package member for packaging said semiconductor element, said package member being comprised of an insulated resin composition material, a flexible insulated substance member being inserted into said package member, and said flexible insulated substance member having lead wires, each of said input/output electrode portions of said semiconductor element being connected electrically to each of said lead wires of said flexible insulated substance member, wherein said package member is fixed to said wiring substrate through a fixing means, separate from said flexible insulated substance member, said fixing means is formed integrally on said package member, a second portion of said heat dissipation body is exposed on a surface of said package member, said heat dissipation body has a dissipation fin member, which is separate from said fixing means, said flexible insulated substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

26. An electronic apparatus having a package structure type semiconductor device, said semiconductor device comprising a heat dissipation body, a semiconductor element mounted on a first portion of said heat dissipation body, said semiconductor element having input/output electrode portions, a package member for packaging said semiconductor element, said package member being comprised of an insulated resin composition material, a flexible insulated substance member being inserted into said package member, and said flexible insulated substance member having lead wires, each of said input/output electrode portions of said semiconductor element being connected electrically to each of said lead wires of said flexible insulated substance member, wherein said package member is fixed to a wiring substrate through a fixing means, separate from said flexible insulated substance member, said fixing means is formed integrally on said package member, a second portion of said heat dissipation body is exposed on a surface of said package member, said heat dissipation body has a dissipation fin member which is separate from said fixing means, whereby said dissipation fin member cools said semiconductor element to set a temperature of below 85° C. during an operation of said semiconductor element, said flexible insulating substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

27. An electronic apparatus having a package structure type semiconductor device, said semiconductor device comprising a heat dissipation body, a semiconductor element mounted on a first portion of said heat dissipation body, said semiconductor element having input/output electrodes of above 400 and having a heat generation amount of above 5 W, a package member for packaging said semiconductor element, said package member being comprised of an insulated resin composition material, a flexible insulated substance member being inserted into said package member, and said flexible insulated substance member having lead wires, each of said input/output electrode portions of said semiconductor element being connected electrically to each of said lead wires of said flexible insulated substance member, wherein said package member is fixed to a wiring substrate through a fixing means, separate from said flexible insulated substance member, said fixing means is formed integrally on said package member, said wiring substrate is connected electrically to said lead wires of said flexible insulated substance member, a second portion of said heat dissipation body is exposed on a surface of said package member, and said heat dissipation body has a dissipation fin member which is separate from said fixing means, whereby said dissipation fin member cools said semiconductor element to set a temperature of below 85° C. during an operation of said semiconductor element, said flexible insulating substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

28. An electronic apparatus having a package structure type semiconductor device, said semiconductor device comprising a heat dissipation body, a semiconductor element mounted on said heat dissipation body, a package member for packaging said semiconductor element, said package member being comprised of an insulated resin composition material, a flexible insulated substance member being inserted into said package member, and said flexible insulated substance member having lead wires, each of said electrode portions of said semiconductor element being connected electrically to each of said lead wires of said flexible insulated substance member, wherein a fixing means, separate from said flexible insulated substance member, is formed integrally with said insulated resin composition material of said package member, said heat dissipation body is fixed adhesively to a wiring substrate, said wiring substrate is connected electrically to said lead wires of said flexible insulated substance member, said wiring substrate serves as a dissipation fin member, said flexible insulating substance member extends outside at least a first portion of said package member, and said fixing means extends outwardly from at least a second portion of said package member different than said first portion so that the mechanical fixing of said package member to said wiring substrate is independent of and separated from the electrical connection of said lead wires to said wiring substrate.

29. A semiconductor device according to claim 1, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

30. A semiconductor device according to claim 2, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

31. A semiconductor device according to claim 3, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

32. A semiconductor device according to claim 4, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

33. A semiconductor device according to claim 5, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

34. A semiconductor device according to claim 7, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

35. A semiconductor device according to claim 8, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

36. A semiconductor device according to claim 9, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

37. A semiconductor device according to claim 10, wherein the package member has a substantially rectangular shape when viewed from the top of the semiconductor device, and wherein the fixing means includes four portions extending, respectively, from the four corners of the rectangular shape while the carrier film member extends outside respective sides of the rectangular shape between the four corners.

38. A semiconductor device according to claim 14, wherein the package member has a substantially rectangular shape when viewed from the top of the semiconductor device, and wherein the fixing means includes four portions extending, respectively, from the four corners of the rectangular shape while the carrier film member extends outside respective sides of the rectangular shape between the four corners.

39. A semiconductor device according to claim 16, wherein the insulated cap member has a substantially rectangular shape when viewed from the top of the semiconductor device, and wherein the fixing means includes four portions extending, respectively, from the four corners of the insulated cap member while the carrier film member extends outside respective sides of the rectangular shape between the four corners.

40. A semiconductor device according to claim 18, wherein the insulated cap member has a substantially rectangular shape when viewed from the top of the semiconductor device, and wherein the fixing means includes four portions extending, respectively, from the four corners of the insulated cap member while the carrier film member extends outside respective sides of the rectangular shape between the four corners.

41. A semiconductor device according to claim 20, wherein the package member has a substantially rectangular shape when viewed from the top of the semiconductor device, and wherein the fixing means extend from the four corners of the rectangular while the flexible insulated substance member extends outside respective sides of the rectangular shape between the four corners.

42. A semiconductor device according to claim 21, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

43. A semiconductor device according to claim 22, wherein the first portion of the electrically insulated base body where said silicon chip member is mounted is an upper side of the electrically insulated base body, and wherein the fixing means extend from a lower surface of the electrically insulated base body while the carrier film member extends beyond peripheral edges of the electrically insulated base body.

44. A semiconductor device according to claim 23, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

45. A semiconductor device according to claim 25, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

46. A semiconductor device according to claim 26, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

47. A semiconductor device according to claim 27, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

48. A semiconductor device according to claim 28, wherein the package member has a substantially rectangular shape when viewed from the top of the semiconductor device, and wherein the fixing means extend from the four corners of the rectangle while the flexible insulated substance member extends outside respective sides of the rectangular shape between the four corners.

* * * * *